United States Patent [19]
Carney et al.

[11] Patent Number: 6,093,972
[45] Date of Patent: Jul. 25, 2000

[54] MICROELECTRONIC PACKAGE INCLUDING A POLYMER ENCAPSULATED DIE

[75] Inventors: Francis J. Carney, Gilbert, Ariz.; George Amos Carson, Elk Grove Village, Ill.; Phillip C. Celaya, Chandler, Ariz.; Harry Fuerhaupter, Lombard, Ill.; Frank Tim Jones, Chandler; Donald H. Klosterman, Gilbert, both of Ariz.; Cynthia M. Melton, Bolingbrook, Ill.; James Howard Knapp, Chandler; Keith E. Nelson, Tempe, both of Ariz.

[73] Assignee: Motorola, Inc., Schaumburg, Ill.

[21] Appl. No.: 09/304,152

[22] Filed: May 3, 1999

Related U.S. Application Data

[62] Division of application No. 08/858,756, May 19, 1997, Pat. No. 5,895,229.

[51] Int. Cl.[7] .................................................. H01L 23/31
[52] U.S. Cl. .......................... 257/790; 257/738; 257/778
[58] Field of Search .................................. 257/778, 790, 257/738

[56] References Cited

U.S. PATENT DOCUMENTS 5,089,440  2/1992  Christie et al. .
5,218,759  6/1993  Juskey et al. .
5,285,352  2/1994  Pastore et al. .
5,302,849  4/1994  Cavasin .
5,371,404  12/1994 Juskey et al. .
5,659,203  8/1997  Call et al. ................................ 257/787
5,864,178  1/1999  Yamada et al. ......................... 257/737
5,900,581  5/1999  Ootake .................................... 257/778

*Primary Examiner*—David Hardy

[57] ABSTRACT

A microelectronic package (10) is formed and includes an integrated circuit die (12) attached to a substrate (14) by a plurality of solder bump interconnections (16) to form a preassembly (18). The integrated circuit die (12) has an active face (20) that faces the substrate (14) and is spaced apart therefrom by a gap (22). The integrated circuit die (12) also includes a back face (24) opposite the active face (20). The substrate (14) includes a die attach region (26) and a surrounding region (28) about the integrated circuit die (12). The solder bump interconnections (16) extend across the gap (22) and connect the integrated circuit die (12) and the substrate (14). A mold (30) is disposed about the preassembly (18) such that the mold (30) cooperates with the substrate (14) to define a mold cavity (32) that encloses the integrated circuit die (12). The mold (30) has a molding surface (34) that includes the surrounding region (28) and a mold surface (34) that faces the back face (24) and is spaced apart therefrom. A polymeric precursor (36) is dispensed into the mold cavity (32) and is formed against the molding surface (34) and the back face (24). The polymeric precursor (36) is then cured to form a polymeric encapsulant (38) that encapsulates the integrated circuit die (12).

5 Claims, 4 Drawing Sheets

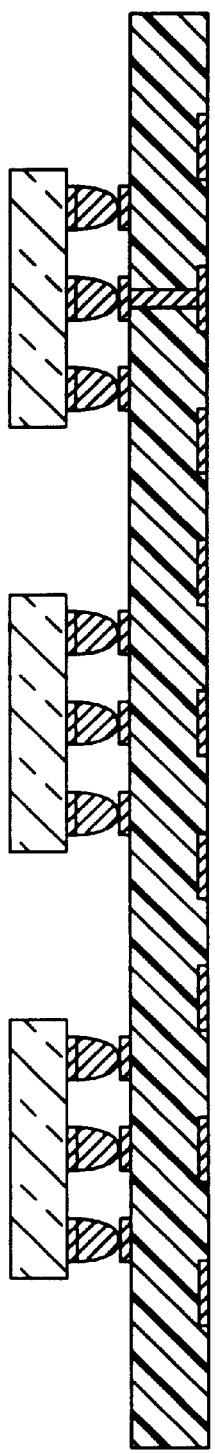
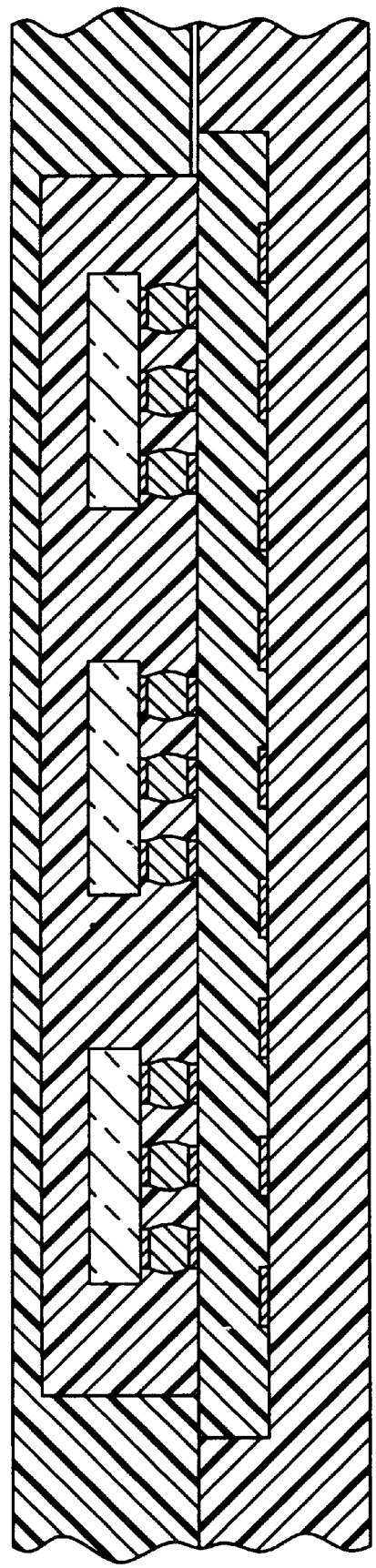
FIG. 1
FIG. 2

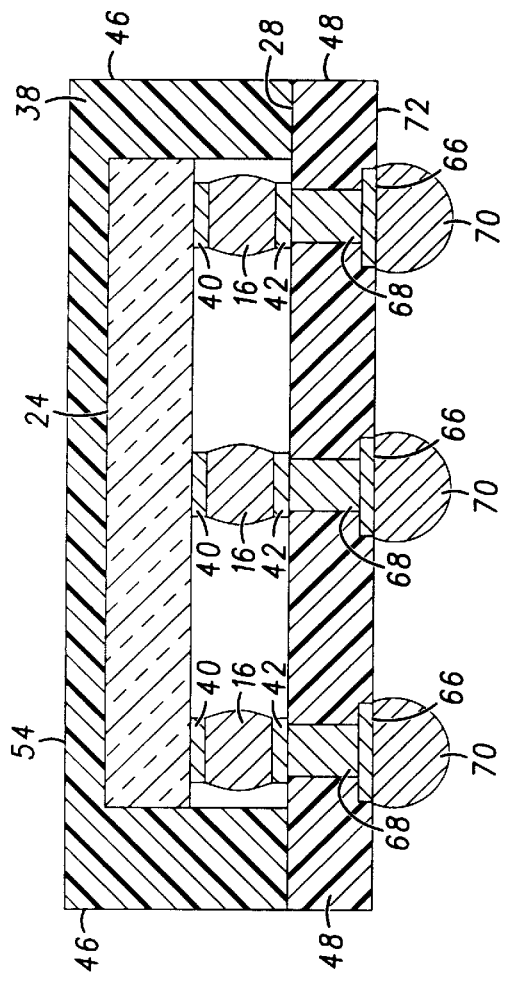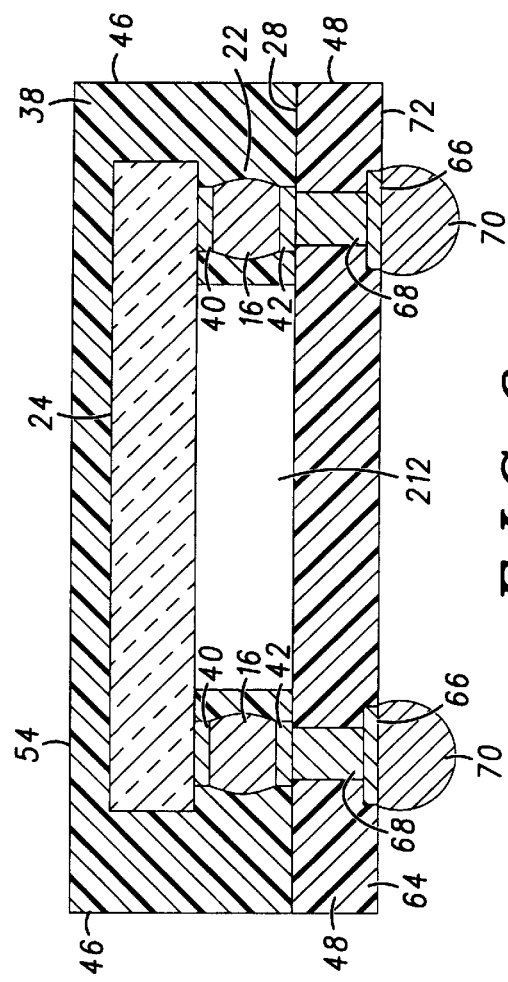

MICROELECTRONIC PACKAGE INCLUDING A POLYMER ENCAPSULATED DIE

The present application is based on prior U.S. application Ser. No. 08/858,756, filed on May 19, 1997, which is hereby incorporated by reference, and priority thereto for common subject matter is hereby claimed.

FIELD OF THE INVENTION

This invention relates generally to a microelectronic package including an integrated circuit die connected to a substrate by solder bump interconnections. More particularly, this invention relates to a package wherein the integrated circuit die is encapsulated within a molded polymeric material.

BACKGROUND OF THE INVENTION

Integrated circuit components, such as integrated circuit die, are attached to substrates, such as printed circuit boards, to form microelectronic assemblies. The integrated circuit components typically include bond pads that are electrically and physically connected to bond pads located on the substrate. This connection can be accomplished by solder bumps.

One technique proposed to attach an integrated circuit component to a substrate is to dispose solder bumps onto the bond pads on the integrated circuit component. The component is then placed onto the substrate such that the solder bumps register with and contact bond pads on the substrate. This preassembly is then heated to reflow the solder bumps. The preassembly is then cooled, whereupon the solder bonds to the bond pads on both the die and the substrate to form solder bump interconnections which electrically and mechanically attach the integrated circuit component to the substrate. The solder bump interconnections extend across the gap formed between the die and the substrate.

One problem faced by the aforementioned assembly is that the solder bump interconnections, because they act to provide the mechanical attachment of the component, need to be reinforced. One such method to enhance the reliability of the assembly is to dispense a polymeric encapsulant in the gap between the component and the substrate. This is accomplished by dispensing a polymeric precursor about the perimeter of the attached component and allowing capillary action to draw the encapsulant into the gap. The assembly is then heated to a temperature sufficient to cure the precursor to form a polymeric encapsulant. The polymeric encapsulant acts to provide enhanced reliability to the assembly by distributing the stresses from the solder bumps and also by encapsulating the solder bump interconnections so that they are not subject to environmental degradation.

Therefore, a need exists for a microelectronic package and the method for forming a package for attaching an integrated circuit component to a substrate that provides enhanced reliability to the solder bump interconnections and also provides protection for the back side of the integrated circuit die. Further, a need exists to accomplish the reinforcement of the solder bumps and the protection of the back side of the integrated circuit die using a less complex manufacturing process.

BRIEF DESCRIPTION OF THE DRAWINGS

FIG. 1 is a cross-sectional view of a plurality of integrated circuit dies overlying a substrate in accordance with a preferred embodiment of the present invention;

FIG. 2 is a cross-sectional view of a preassembly formed by attaching the integrated circuit die in FIG. 1 to the substrate and disposing a mold and a polymeric precursor about the preassembly;

FIG. 5 is a cross-sectional view of a microelectronic package formed in accordance with an alternate embodiment of the present invention; and FIG. 6 is a cross-sectional view of a microelectronic package formed in accordance with a further alternate embodiment of the present invention.

DETAILED DESCRIPTION OF A PREFERRED EMBODIMENT

Figure 3A:
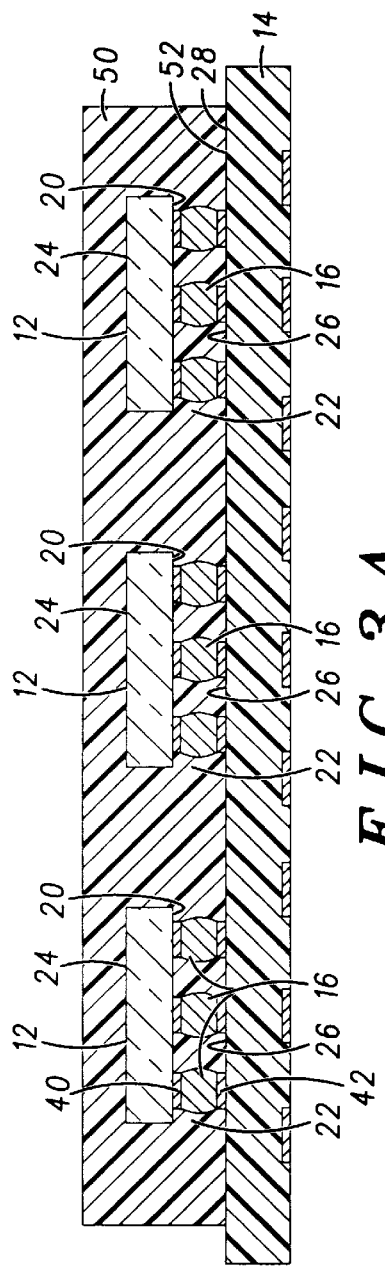
FIG. 3A is a cross-sectional view of the preassembly in FIG. 2 after curing the polymeric precursor to form a polymeric encapsulant panel and removing the mold.

The present invention forms a microelectronic package that includes an integrated circuit die attached to a substrate by solder bump interconnections and is overmolded with a polymeric encapsulant. The package is formed by attaching an integrated circuit die to a substrate by a plurality of solder bump interconnections to form a preassembly. The integrated circuit die includes an active face that faces the substrate and is spaced apart therefrom by a gap. The die also includes a back face that is located opposite the active face. The substrate includes a die attach region and a surrounding region about the integrated circuit die. The plurality of solder bump interconnections extend across the gap and connect the integrated circuit die and the substrate. A mold is disposed onto the preassembly such that the mold cooperates with the substrate to define a mold cavity. The mold cavity encloses the integrated circuit die and includes a molding surface that includes the surrounding region and a mold surface facing the back face and spaced apart therefrom. A polymeric precursor is dispensed into the mold cavity and forms against the molding surface and the back face. The polymeric precursor is cured to form a polymeric encapsulant that encapsulates the integrated circuit die.

The present invention can be better understood with reference to FIGS. 1–6. FIG. 1 shows a plurality of integrated circuit die 12 overlying a substrate 14. Each integrated circuit die 12 is preferably formed of silicon and includes die bond pads 40. By way of an example of a preferred embodiment, solder deposits 44 are formed on die bond pads 40. Die bond pads 40 are formed on active face 20, and die 12 includes back face 24 opposite active face 20. Solder deposits 44 are deposited by stencil printing, plating, evaporation, or any other suitable method. Solder deposits 44 are preferably a eutectic tin-lead alloy being composed of about 63 weight percent tin and the balance substantially lead and having a melting temperature of about 183° C. Die 12, with solder deposits 44 formed on the die bond pads 40, is superposed onto a substrate 14 for connection thereto.

Substrate 14 is preferably a laminated printed circuit board comprising a high temperature resin and glass fiber composite, such as Bismaleimide Triazine (BT resin) or FR5. Substrate 14 may alternately be formed of ceramic, silicon, glass-filled epoxy resin, arimid, polyester, twice deposited dielectrics, or polyimide. Alternately, substrate 10 could be formed of an integrated circuit die or a flexible substrate.

Substrate 14 includes a die attachment face 52 that includes a die attach region 26 and a surrounding region 28 about die attach region 26. Substrate 14 includes package bond pads 66 formed on substrate 72, opposite die attachment face 52. Substrate 14 includes a plurality of bond pads 42 located at die attach region 26. Substrate bond pads 42 are electrically connected to package bond pads 66, preferably through vias 68 that run through substrate 14. Although each substrate bond pad will be electrically coupled to a corresponding package bond pad 66, only one such via 68 is shown in the FIGS. Vias 68 can be formed by punching, laser drilling, milling, photo-definition, or other suitable techniques. The electrical connection can be formed by electroplating the via to provide an electrical connection, or the via can be filled with a conductive material, such as a solder paste or a conductive adhesive.

Die 12 is superposed such that each solder deposit 44 registers with a corresponding substrate bond pad 42. Substrate bond pads 42 are preferably formed of copper, but can alternately be formed of any solder-wettable material. In a preferred embodiment, a fluxing agent is dispensed onto substrate bond pads 42 prior to superposition of die 12. The fluxing agent is preferably a no-clean flux containing an acid fluxing vehicle, such as succinic acid, glutaric acid, adipic acid, or a combination of the above.

Die 12 and substrate 14 are then heated above the melting temperature of the solder deposits 44 to reflow the solder as depicted in FIG. 2. The reflowed solder melts about substrate bond pads 42. Die 12 and substrate 14 are then cooled to solidify the solder to form solder bump interconnections 16. Preassembly 18 is thereby formed and includes die 12, substrate 14, and solder bump interconnections 16. Gap 22 is formed between active face 20 and die attach region 26. Solder bump interconnections 16 extend across gap 22 and connect integrated circuit die 12 and substrate 14.

As shown in FIG. 2, preassembly 18 is placed into a mold 30. Mold 30 preferably comprises two plates, a top plate 29 that defines the outline of the finished encapsulant panel and a bottom plate 31 that includes recess 62. Recess 62 is preferably slightly larger than substrate 14 and holds substrate 14. Plates 29 and 31 meet at a parting line 58 that is preferably coplanar with surrounding region 28 of substrate 14. Mold 30 is held together under force and heated to about 175° C. Polymeric precursor 36 is preferably preheated and is injected into mold cavity 32 through opening 60.

Mold 30 is preferably formed of tool carbon steel, but can alternately be formed of aluminum or stainless steel. The size of mold 30 depends upon the size of the substrate used. Preferable panel sizes include 96×40 mm, 216×64 mm, or 102×63 mm. Substrate 14 is disposed into recess 62 of bottom plate 31 and forms a molding surface 34 with substrate 14. Molding surface 34 cooperates with surrounding region 28 of substrate 14 to define mold cavity 32. Mold 30 includes an inner face 56 that faces and is spaced apart from back face 24 of die 12 upon disposition of mold 30.

A polymeric precursor 36 is dispensed by injection into mold cavity 32 through opening 60. Polymeric precursor 36 is a multi-functional resin epoxy that is filled with 70 weight percent or more silica or alumina. A preferred epoxy precursor 36 is commercially available from Nitto Denko under the trade name MP-100 1HG or 2HG. Alternative epoxy precursors are commercially available from Sumitomo under the trade name EME 7720 S and from Ciba Geigy under the trade name ARATRONIC 2217.

Polymeric precursor 36 fills mold cavity 32 and forms and is shaped against molding surface 34 and back face 24 of integrated circuit die 12. In a preferred embodiment, polymeric precursor 36 flows into and substantially fills gap 22 and encapsulates solder bump interconnections 16. The molding and flow characteristics of precursor 36 are influenced in part by the weight percentage of filler particles, the distribution of filler size and hardeners, and the resin used. The geometry of the part being molded sets up differential resistance to the mold flow. It is typically easier for precursor 36 to flow over back face 24 of die 12, which is a relatively wide gap compared to gap 22. The solder bump interconnections 16 also tend to provide resistance to flow of precursor 36 into gap 22. Precursor 36 is then cured to form polymeric encapsulant panel 50 that encapsulates each of the integrated circuit die 12, as depicted in FIG. 3A. Polymeric encapsulant panel 50 covers die 12 and includes a polymeric back surface 54.

Figure 3B:
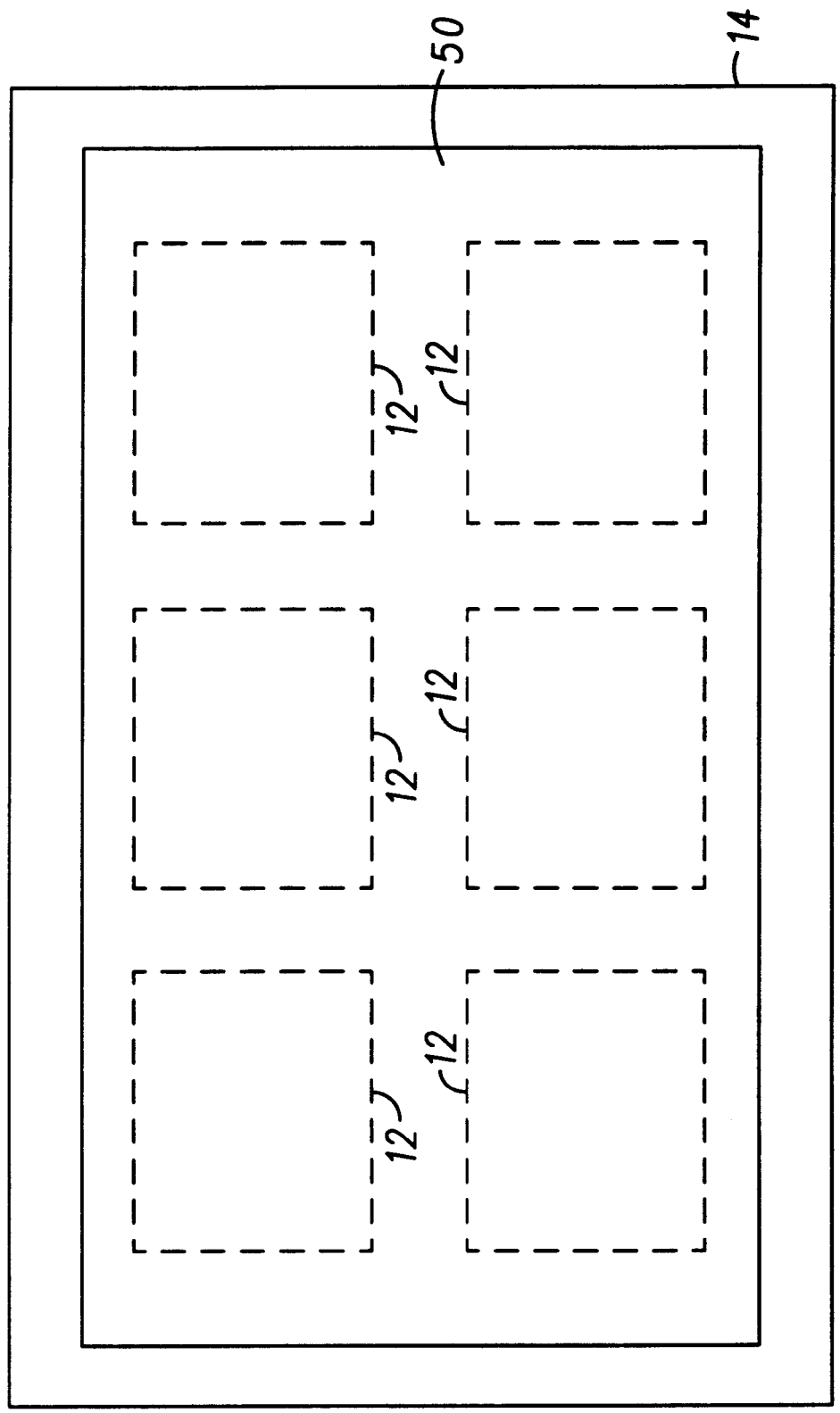
FIG. 3B is a top view of the preassembly in FIG. 2 after curing the polymeric precursor and showing the plurality of integrated circuit dies in phantom.

As depicted in FIG. 3B, a plurality of integrated circuit dies 12 may be attached to substrate 14. In this manner, molding a plurality of integrated circuit die can be accomplished without the handling difficulties associated with handling individual die and individual packages. Further, upon forming encapsulant panel 50, the die may be singulated to form microelectronic packages in which the encapsulant sides are coextensive with the perimeter edges of the carrier substrate. This allows for a package in which the die is protected by the encapsulant and where the package footprint is minimized. Molding a plurality of die also eliminates problems associated with encapsulating an individual die, due to the die's small size.

Figure 4:
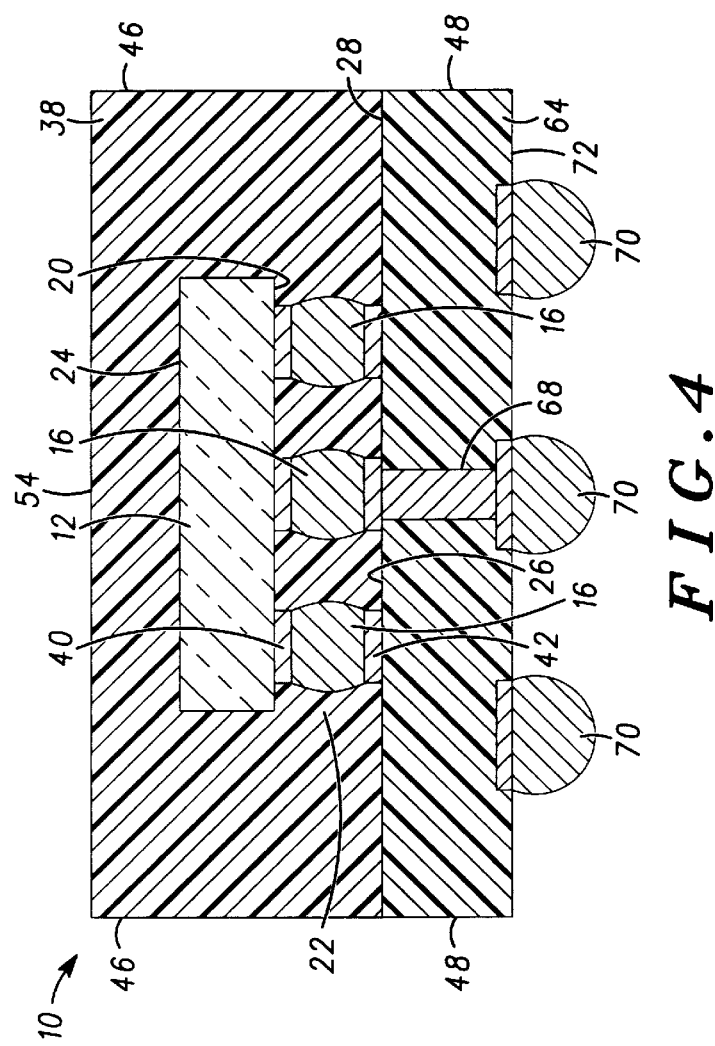
FIG. 4 is a cross-sectional view of a microelectronic package formed by separating the integrated circuit die in FIG. 3A.

In a preferred embodiment, as depicted in FIG. 4, microelectronic package 10 is formed by separating each of the plurality of integrated circuit die 12 by cutting the encapsulant panel 50 and the substrate 14 to form a microelectronic package 10. Polymeric encapsulant 38 is thereby formed of a singular polymeric body and includes encapsulant sides 46 extending in a plane that is generally perpendicular to active face 20 of integrated circuit die 12. Encapsulant sides 46 are coextensive with carrier sides 48 that perpendicularly intersect the face of carrier substrate 64. Encapsulant 38 preferably substantially underfills integrated circuit die 12.

Microelectronic packages 10 formed by the present invention may be attached to other substrates. A plurality of solder bumps 70 are formed on substrate back side 72, opposite integrated circuit die 12 and polymeric encapsulant 38. Package 10 is superposed onto a printed circuit board or the like such that solder bumps 70 register with bond pads on the printed circuit board. Solder bumps 70 are then attached to the bond pads, by reflowing or the like. Solder bumps 70 preferably have a lower melting temperature than solder bump interconnections 16 formed between die 12 and carrier substrate 64, such that solder bump interconnections 16 do not reflow when attaching microelectronic package to the substrate.

In an alternate embodiment, as depicted in FIG. 5, a similar process as the preferred embodiment is used to cover an integrated circuit die 112 with a polymeric precursor. A polymeric encapsulant 138, however, covers integrated circuit die 112 but does not underfill die 112. In this case, the viscosity and surface tension of the polymeric precursor and the gap 122 are such that underfilling of die 112 does not occur. Die 112 may substantially collapse toward carrier substrate 164 such that gap 122 is approximately 25 microns. Preventing underfill of die 112 is preferable when access to the active face 120 of die 112 is necessary, as in the case of providing heat dissipation by applying a thermally conductive material between the active face 120 of die 112 and carrier substrate 164. Preventing underfill of die 112 may be accomplished if the filler particles are large, if gas is entrapped in gap 122, if cavity walls or solder columns provide drag on the precursor, or for fine pitch interconnects. Without underfill, compliance issues between die 112 and carrier substrate 164 are minimized. Lack of underfill will also result for fine pitch solutions, typically less than about 6 mils (150 microns), that will prevent uniform flow of the mold material past substrate bond pads 142 and under die 112. This leads to an assembly that is more robust to the presence of moisture, and the possibility of delamination-induced failure is eliminated.

In a further alternate embodiment, as depicted in FIG. 6, a polymeric encapsulant 238 extends partially under integrated circuit die 212. A similar process is used as in the preferred embodiment. However, the integrated circuit die 212 includes a plurality of solder bump interconnections 216 that are formed about the perimeter of die 212. A polymeric encapsulant 238 partially underfills a portion of gap 222 about solder bump interconnections 216 formed about the perimeter of die 212 but does not underfill the center portion of die 212. This is accomplished if steps are not taken to intentionally remove the air from gap 222 during underfilling. Solder bump interconnections 216 may be underfilled to ensure reliability, but additional process engineering to remove the air void is not required, thereby leading to a simplified manufacturing process.

The present invention provides a microelectronic package and the method for forming the package that includes a single process for underfilling the die and protecting the back face of the die. The package is preferably formed by attaching a plurality of integrated circuit die to a substrate and overmolding all of the die with a polymeric precursor. The polymeric precursor is then cured to form a polymeric encapsulant. Microelectronic packages are formed by cutting through the encapsulant and substrate to singulate the dies to form microelectronic packages. Each package includes an integrated circuit die attached to a substrate by solder bump interconnections and completely encapsulated within a polymeric encapsulant. By singulating the overmolded dies, a microelectronic package is formed that optimizes protection of the integrated circuit die while minimizing the footprint of the package. Further, the back side of the die is overmolded, thereby protecting the die back face from damage that can occur during manufacturing, handling, or use of the package.

The polymeric encapsulant may flow such that it substantially underfills the gap, or it may partially flow into the gap, or not flow into the gap at all. Factors that determine how much of the gap is underfilled include the size of the gap, the flow characteristics of the polymeric material, and the size of the filler particles used in the polymeric precursor. By substantially underfilling the gap, bonding area is maximized and there is uniform stress distribution across the die and the substrate. The solder joints and overall structure are thereby reinforced. By partially underfilling the gap such that the polymeric encapsulant encapsulates the solder bump interconnections but does not extend under the central portion of the integrated circuit die, compliance issues are avoided between the integrated circuit die and the substrate. By using a polymeric precursor that does not underfill the die, the manufacturing process is simplified due to elimination of the step of evacuating air from the gap.

The present invention may be used to form a polymeric body about an individual integrated circuit component mounted onto a substrate, or in a preferred embodiment a plurality of integrated circuit dies are simultaneously attached to a substrate and covered with a polymeric precursor in a mold cavity. The precursor is then cured to form a substantially cross-linked polymeric encapsulant panel. The integrated circuit die are then separated by cutting through the polymeric encapsulant panel and the substrate to form individual microelectronic packages.

While this invention has been described in terms of certain examples thereof, it is not intended that it be limited to the above description, but rather only to the extent set forth in the claims that follow.

The embodiments of this invention in which an exclusive property or privilege is claimed are defined as follows:

What is claimed is:

1. A microelectronic package comprising:
   a carrier substrate that includes a die attachment face and carrier sides about the die attachment face, said die attachment face comprising a die attach region and a surrounding region about the die attach region;
   an integrated circuit die overlying the die attach region and spaced apart therefrom by a gap, said integrated circuit die including an active face facing the die attach region and a back face opposite the active face;
   a plurality of solder bump interconnections that extend across the gap and connect the integrated circuit die to the die attach region; and
   an encapsulant formed of a singular polymeric body overlying the back face and molded against the surrounding region so as to encapsulate the die therein, said body comprising sides coextensive with said carrier sides.

2. A microelectronic package in accordance with claim 1, wherein the encapsulant substantially fills the gap.

3. A microelectronic package in accordance with claim 1, wherein the encapsulant is spaced apart from the plurality of solder bump interconnections.

4. A microelectronic package in accordance with claim 1, wherein the plurality of solder bump interconnections are formed about the perimeter of the integrated circuit die, and wherein the encapsulant encloses the plurality of solder bump interconnections, and wherein an air gap is created between the integrated circuit die and substrate within the encapsulant.

5. A microelectronic package comprising:
   a carrier substrate that includes a die attachment face, carrier sides perpendicular to the die attachment face, a substrate back side opposite the die attachment face, and a plurality of package bond pads located on the substrate back side, said die attachment face comprising a die attach region and a surrounding region about the die attach region;
   an integrated circuit die overlying the die attach region and spaced apart therefrom by a gap, said integrated circuit die including an active face facing the die attach region and a back face opposite the active face;
   a plurality of solder bump interconnections that extend across the gap and connect the integrated circuit die to the die attach region;
   an encapsulant formed of a singular polymeric body overlying the back face and molded against the surrounding region so as to encapsulate the die therein, said body comprising sides coextensive with said sides; and
   a plurality of solder bumps attached to the package bond pads on the substrate back side of the substrate.

* * * * *